US010019046B2

(12) United States Patent
Shen (10) Patent No.: US 10,019,046 B2
(45) Date of Patent: Jul. 10, 2018

(54) INTERNAL FRAME STRUCTURE WITH HEAT INSULATION EFFECT AND ELECTRONIC APPARATUS WITH THE INTERNAL FRAME STRUCTURE

(71) Applicant: ASIA VITAL COMPONENTS CO., LTD., New Taipei (TW)

(72) Inventor: Ching-Hang Shen, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 23 days.

(21) Appl. No.: 14/828,499

(22) Filed: Aug. 17, 2015

(65) Prior Publication Data

US 2017/0055367 A1 Feb. 23, 2017

(51) Int. Cl.
| | |
|---|---|
| *G06F 1/20* | (2006.01) |
| *H05K 7/20* | (2006.01) |
| *G06F 1/16* | (2006.01) |
| *H04M 1/02* | (2006.01) |

(52) U.S. Cl.
CPC ............ *G06F 1/203* (2013.01); *G06F 1/1643* (2013.01); *H04M 1/026* (2013.01); *H04M 1/0249* (2013.01); *H05K 7/20336* (2013.01)

(58) Field of Classification Search
CPC .... H05K 7/20336; H05K 7/2099; G06F 1/20; G06F 1/203; H02M 1/0202; H02M 1/0249; H02M 1/026; H04M 1/0202; H04M 1/0249; H04M 1/026
See application file for complete search history.

(56) References Cited

U.S. PATENT DOCUMENTS

| | | | | |
|---|---|---|---|---|
| 6,222,732 | B1 * | 4/2001 | Jakob | H05K 1/0209 174/252 |
| 6,418,017 | B1 * | 7/2002 | Patel | G06F 1/203 165/104.33 |
| 9,128,666 | B2 * | 9/2015 | Werner | G06F 1/1626 |
| 9,274,568 | B2 * | 3/2016 | Pegg | H04M 1/026 |
| 9,535,470 | B2 * | 1/2017 | Wu | G06F 1/203 |
| 2013/0141870 | A1 * | 6/2013 | Rothkopf | G06F 1/1626 361/707 |
| 2014/0177151 | A1 * | 6/2014 | Manda | H04M 1/0252 361/679.3 |
| 2015/0055300 | A1 * | 2/2015 | Hsieh | G06F 1/20 361/700 |
| 2015/0342089 | A1 * | 11/2015 | Kim | H05K 7/20336 361/700 |
| 2016/0227654 | A1 * | 8/2016 | Kim | G06F 1/16 |

* cited by examiner

*Primary Examiner* — Zachary M Pape
(74) *Attorney, Agent, or Firm* — Jackson IPG PLLC; Demian K. Jackson (57) ABSTRACT

An internal frame structure with heat insulation effect and an electronic apparatus with the internal frame structure. The internal frame includes a main body and a frame unit. A heat insulation layer is formed between the main body and the frame unit and positioned on at least two opposite sides of the main body. The heat insulation layer has a first side connected with the main body and a second side connected with the frame unit. The heat insulation layer serves to insulate the heat of the main body from being transferred to the frame unit.

6 Claims, 7 Drawing Sheets

INTERNAL FRAME STRUCTURE WITH HEAT INSULATION EFFECT AND ELECTRONIC APPARATUS WITH THE INTERNAL FRAME STRUCTURE

BACKGROUND OF THE INVENTION

1. Field of the Invention

The present invention relates generally to a portable electronic apparatus, and more particularly to an internal frame structure with heat insulation effect and an electronic apparatus with the internal frame structure.

2. Description of the Related Art

Recently, the sizes of the intelligent personal electronic apparatuses such as mobile phones, tablets and portable readers have become larger and larger. In contrast, the thicknesses of the intelligent personal electronic apparatuses have become thinner and thinner. As a result, the heat dissipation performance of the electronic apparatus has become poorer and poorer. Most of the heat of the electronic apparatus is generated by the respective functional units in working, such as the central processor, the battery, the power converter and the display screen. (Especially, in the case that the central processor is equipped with a multi-core operation unit to enhance the execution speed, the heat dissipation problem of the terminal equipment will be more serious). When operating, all these units will generate a great amount of heat. Currently, the heat source of the electronic apparatus is generally fixed on an internal frame structure of the electronic apparatus. Therefore, the internal frame will first absorb the heat generated by the respective functional units when executing the functions. As a result, after the electronic apparatus is turned on to operate, the temperature of the internal frame will rise abruptly and the main body and the periphery of the internal frame will have an extremely high temperature. The existent electronic apparatus often has a larger size, (for example, the mainstream touch mobile phone often has a size of over five inches). Therefore, when a user holds the electronic apparatus with his/her hand, the user can hardly fully hold the electronic apparatus and can simply grasp the electronic apparatus with fingers. The contact point or position where the user grasps the electronic apparatus is often positioned on the outer periphery of the internal frame or the two longer sides of the electronic apparatus. Therefore, in the case that the high heat is transferred to the outer periphery of the internal frame, the user can hardly comfortably hold the electronic apparatus. This will bother the user and lead to inconvenience in use of the electronic apparatus.

SUMMARY OF THE INVENTION

It is therefore a primary object of the present invention to provide an internal frame structure with heat insulation effect. The internal frame structure includes a heat insulation layer for insulating the heat from being transferred to the frame unit of the internal frame.

It is a further object of the present invention to provide the above internal frame structure, which is applied to an electronic apparatus to insulate the heat generated by the internal electronic components of the electronic apparatus from being transferred to the periphery of the electronic apparatus.

To achieve the above and other objects, the internal frame structure with heat insulation effect of the present invention includes a main body and a frame unit. A heat insulation layer is formed between the main body and the frame unit and positioned on two opposite sides of the main body. The heat insulation layer has a first side connected with the main body and a second side connected with the frame unit.

The electronic apparatus with the internal frame structure of the present invention includes: a display module having a front face; a front case connected with the display module, the front case being formed with a window, the front face of the display module showing through the window; and an internal frame connected with the front case. The internal frame includes a main body and a frame unit. A heat insulation layer is formed between the main body and the frame unit and positioned on two opposite sides of the main body. The heat insulation layer has a first side connected with the main body and a second side connected with the frame unit. Multiple internal electronic components of the electronic apparatus are disposed on the main body.

In the above electronic apparatus, the internal frame is connected with a back case or directly integrally formed with a back case.

In the above electronic apparatus, the main body is made of metal material or nonmetal material.

In the above electronic apparatus, the frame unit is made of metal material or nonmetal material.

In the above electronic apparatus, the display module is a touch display module and the front face of the display module is a touch display face.

In the above electronic apparatus, the first and second sides of the heat insulation layer define therebetween a thickness.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The present invention relates to an internal frame structure with heat insulation effect. The internal frame structure includes a main body and a frame unit disposed along the periphery of the main body. A heat insulation layer is formed between the main body and the frame unit and positioned on at least two opposite sides of the main body. The heat insulation layer has a first side connected with the periphery of the main body and a second side connected with the frame unit.

Figure 1A:
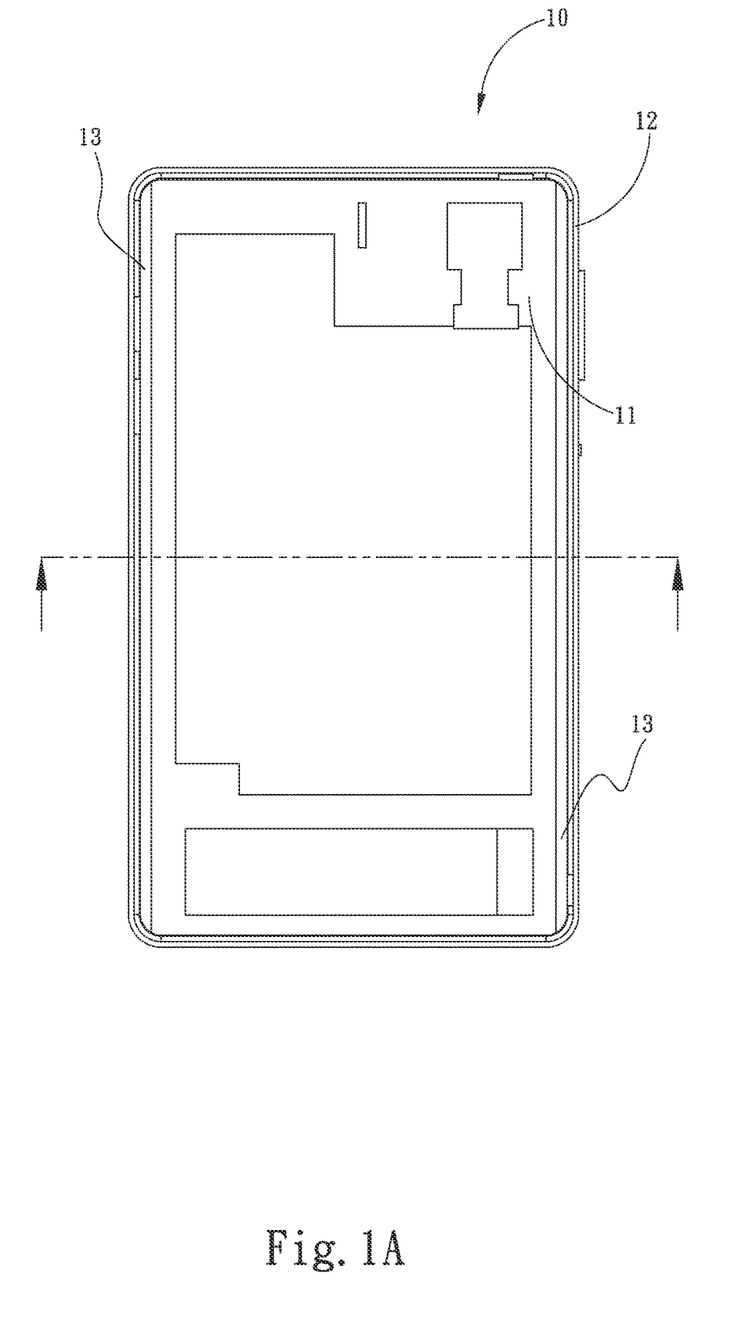
FIG. 1A is a plane view of the internal frame structure of the present invention.
Figure 1B:
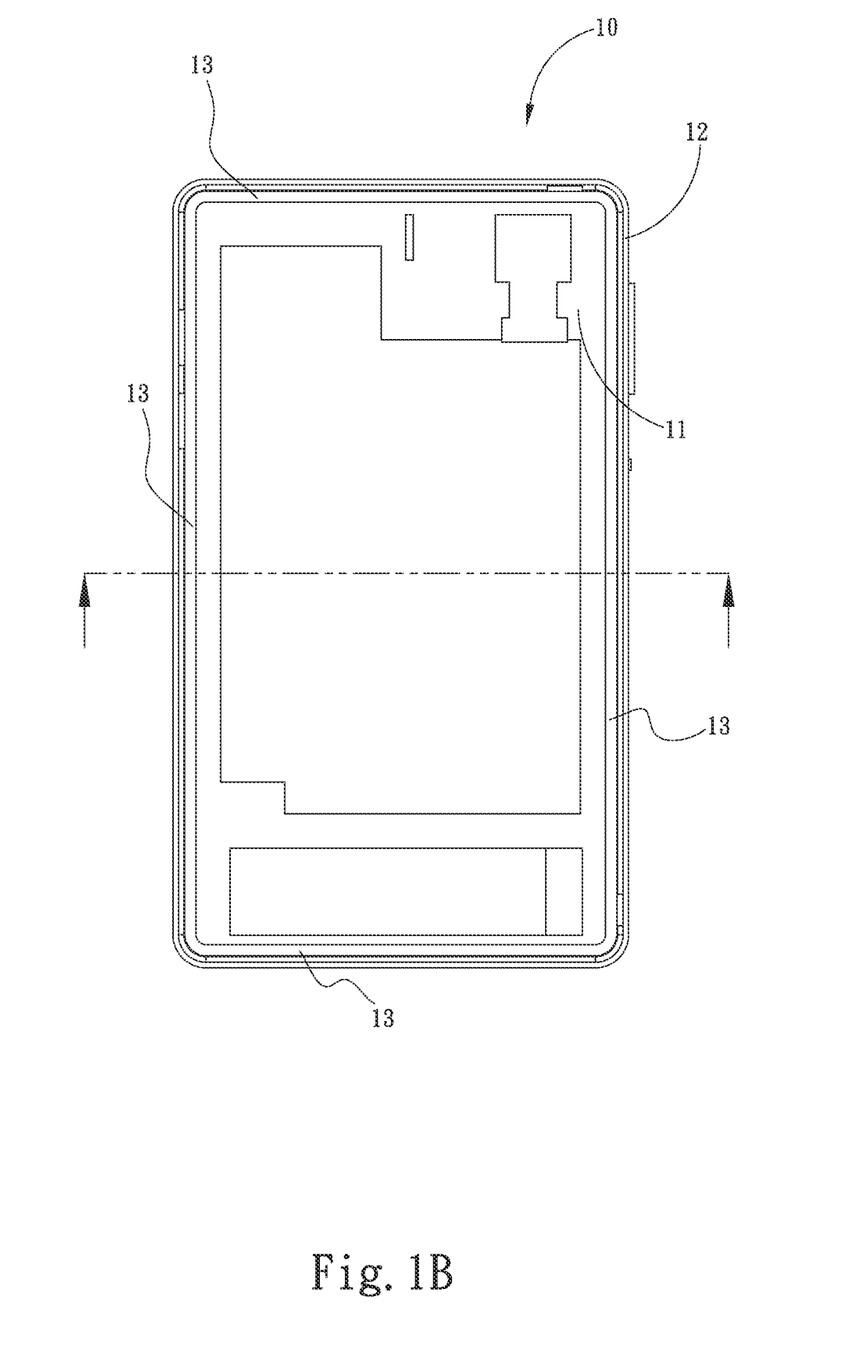
FIG. 1B is a plane view of another embodiment of the internal frame structure of the present invention.
Figure 2A:
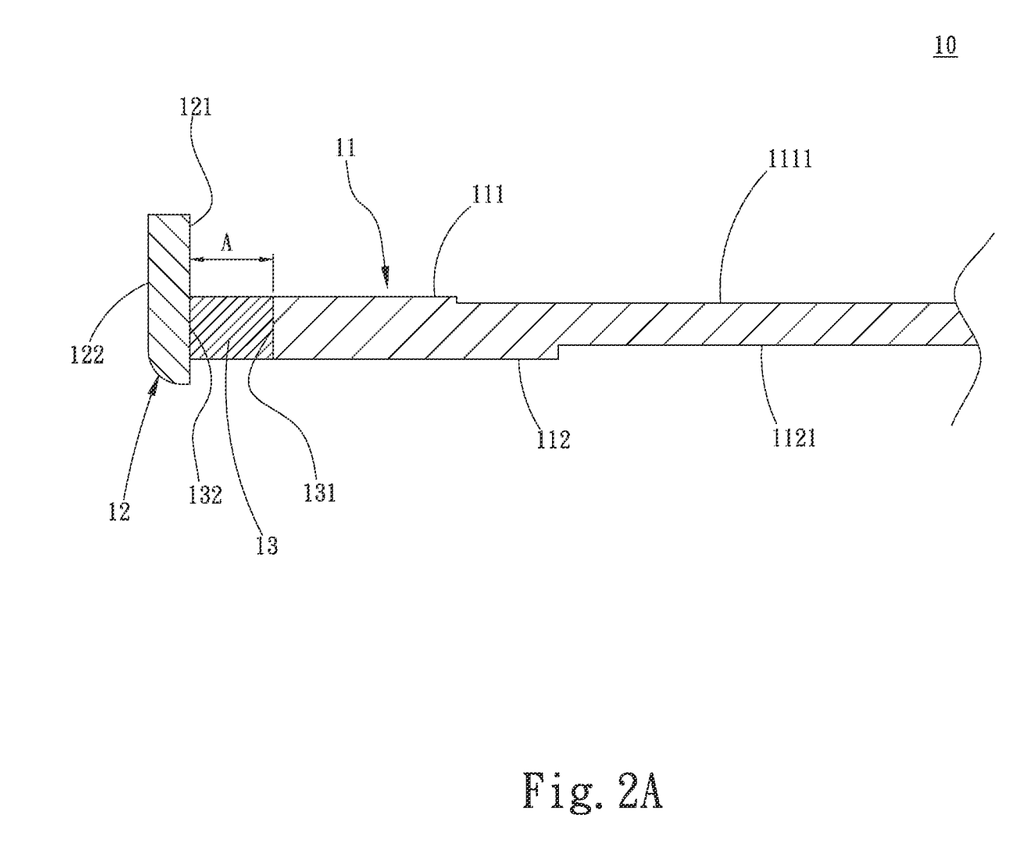
FIG. 2A is a sectional view of a part of the internal frame structure of the present invention.
Figure 2B:
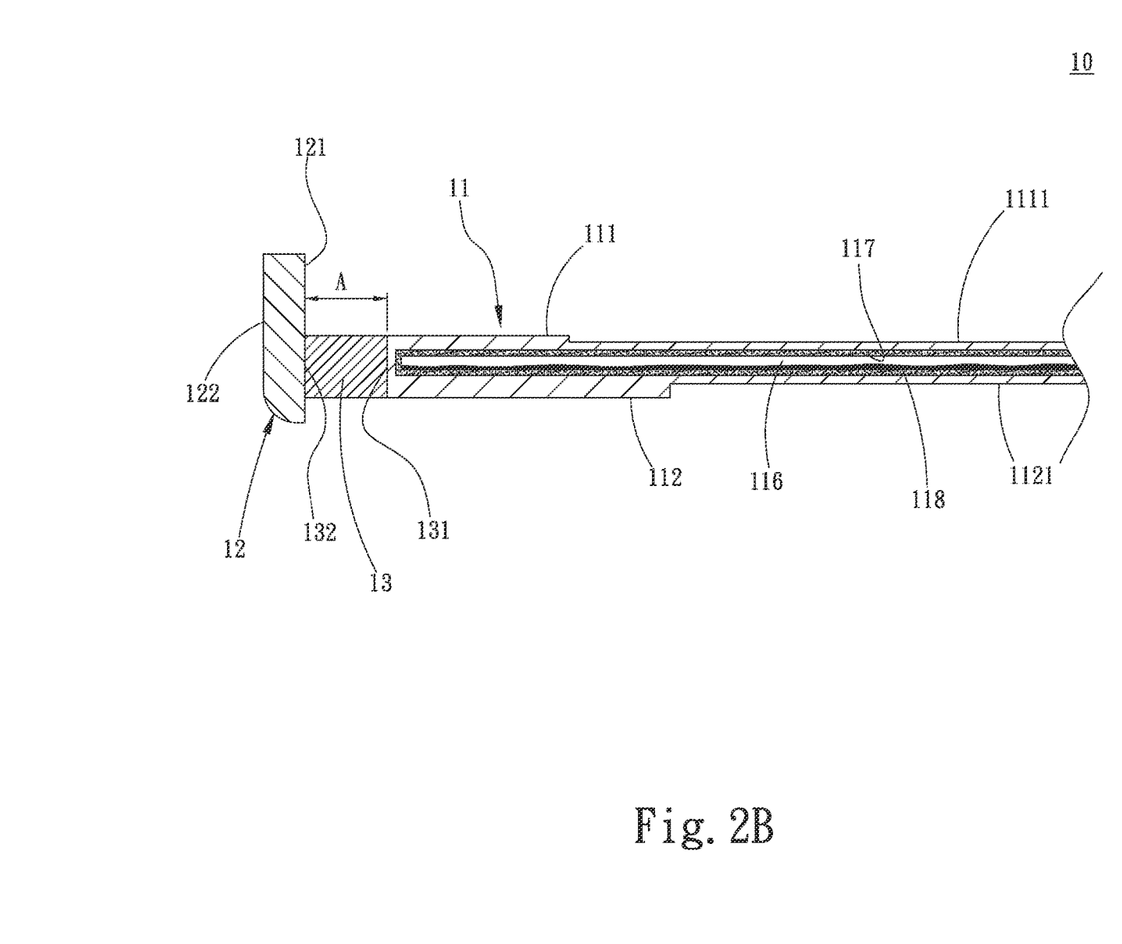
FIG. 2B is a sectional view of a part of another embodiment of the internal frame structure of the present invention.

Please refer to FIGS. 1A, 1B, 2A and 2B. FIG. 1A is a plane view of the internal frame structure of the present invention. FIG. 1B is a plane view of another embodiment of the internal frame structure of the present invention. FIG. 2A is a sectional view of a part of the internal frame structure of the present invention. FIG. 2B is a sectional view of a part of another embodiment of the internal frame structure of the present invention. As shown in the drawings, the internal frame 10 is applied to an electronic apparatus for supporting and protecting various components in the electronic apparatus and enhancing the structural strength of the electronic apparatus. When the electronic apparatus is compressed or forced, the internal frame 10 serves to directly protect the electronic apparatus. The internal frame 10 is at least partially made of metal. Alternatively, the internal frame 10 can be entirely made of metal material. The metal material has better strength so that the internal frame 10 has better strength as a whole. The metal material is such as stainless steel, aluminum, aluminum-magnesium alloy, aluminum-titanium alloy, etc.

As shown in FIG. 1A, the internal frame 10 includes a main body 11 and a frame unit 12. The frame unit 12 is disposed along outer periphery of the main body 11. A heat insulation layer 13 is formed between the main body 11 and the frame unit 12. The heat insulation layer 13 is positioned on two opposite sides of the main body 11. In this embodiment, the heat insulation layer 13 is positioned on left and right sides of the main body 11. In another embodiment, the heat insulation layer 13 is positioned on four sides of the main body 11 as shown in FIG. 1B.

The main body 11 has a first surface 111 and a second surface 112. The first and second surfaces 111, 112 are respectively formed with multiple connection structures such as recesses, perforations, latch plates, posts or an assembly thereof. In this embodiment, the connection structures are recesses 1111, 1121. Multiple internal electronic components of the electronic apparatus are mounted on the first surface 111 and/or the second surface 112 of the main body 11 via the connection structures. The frame unit 12 has an inner periphery adjacent to the periphery of the main body 11 and an outer periphery opposite to the inner periphery 121.

In a preferred embodiment, the main body 11 and the frame unit 12 are respectively made of metal material and/or nonmetal material.

As shown in FIG. 2B, in another embodiment, the main body 11 is a flat-plate heat pipe or heat spreader or vapor chamber. The main body 11 has an internal closed chamber 116. A capillary structure 117 and a working fluid 118 are disposed in the closed chamber 116. Vapor-liquid circulation of the working fluid 118 takes place in the closed chamber 111 to uniformly spread the heat over the main body 11.

Figure 3:
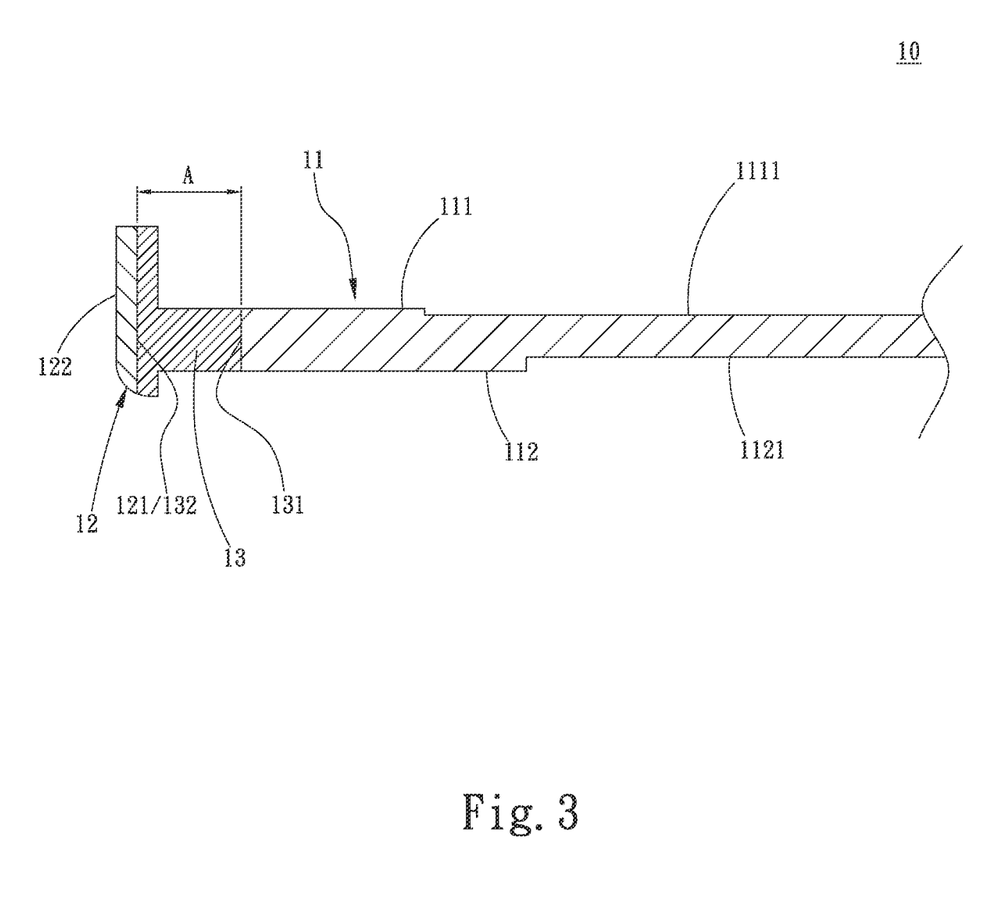
FIG. 3 is a sectional view of a part of still another embodiment of the internal frame structure of the present invention.

Further referring to FIGS. 1A, 1B and 2A, the heat insulation layer 13 has a first side 131 connected with the periphery of the main body 11 and a second side 132 connected with the inner periphery of the frame unit 12. The first and second sides 131, 132 of the heat insulation layer 13 define therebetween a thickness A. In a preferred embodiment as shown in FIGS. 2A and 2B, the second side 132 of the heat insulation layer 13 is connected with and covers a part of the surface of the inner periphery 121 of the frame unit 12. In another embodiment as shown in FIG. 3, the second side 132 of the heat insulation layer 13 is connected with and covers the entire surface of the inner periphery 121 of the frame unit 12.

The heat insulation layer 13 is made of thermal insulation material. The thermal insulation material is also referred to as heat insulation material. The thermal insulation material is such as polyurethane foam body, fiber glass, asbestos, ethylene propylene rubber (EPDM) or aromatic polyamide fiber. Preferably, the heat insulation layer 13 is composed of ethylene propylene rubber (EPDM) and aromatic polyamide fiber or ethylene propylene rubber (EPDM) and asbestos. The heat insulation layer 13 is made of the thermal insulation material so that the heat generated by the internal electronic components and absorbed by the main body 11 will not be transferred to the frame unit 12.

Figure 4:
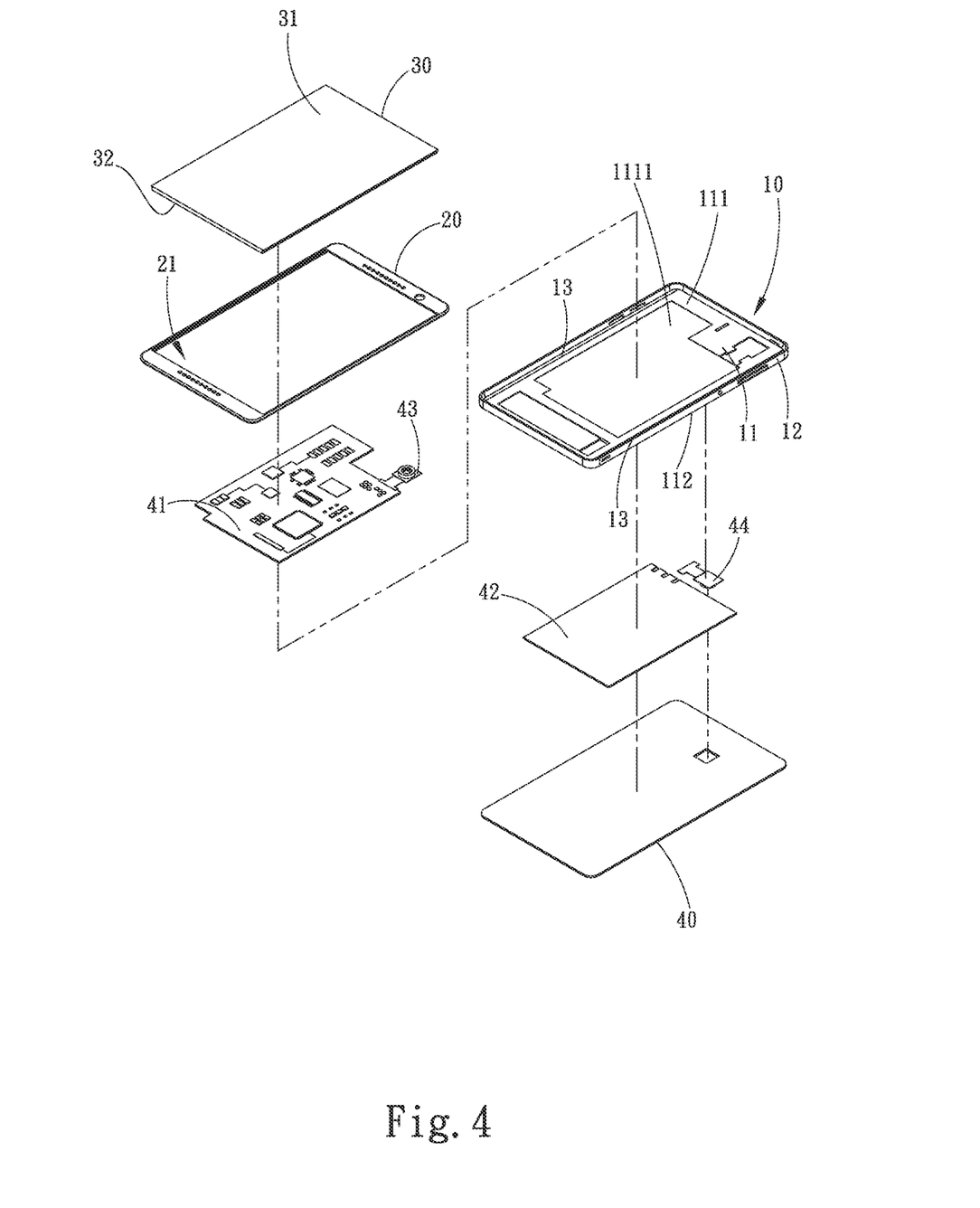
FIG. 4 is a perspective exploded view showing that the internal frame structure of the present invention is applied to an electronic apparatus.
Figure 5:
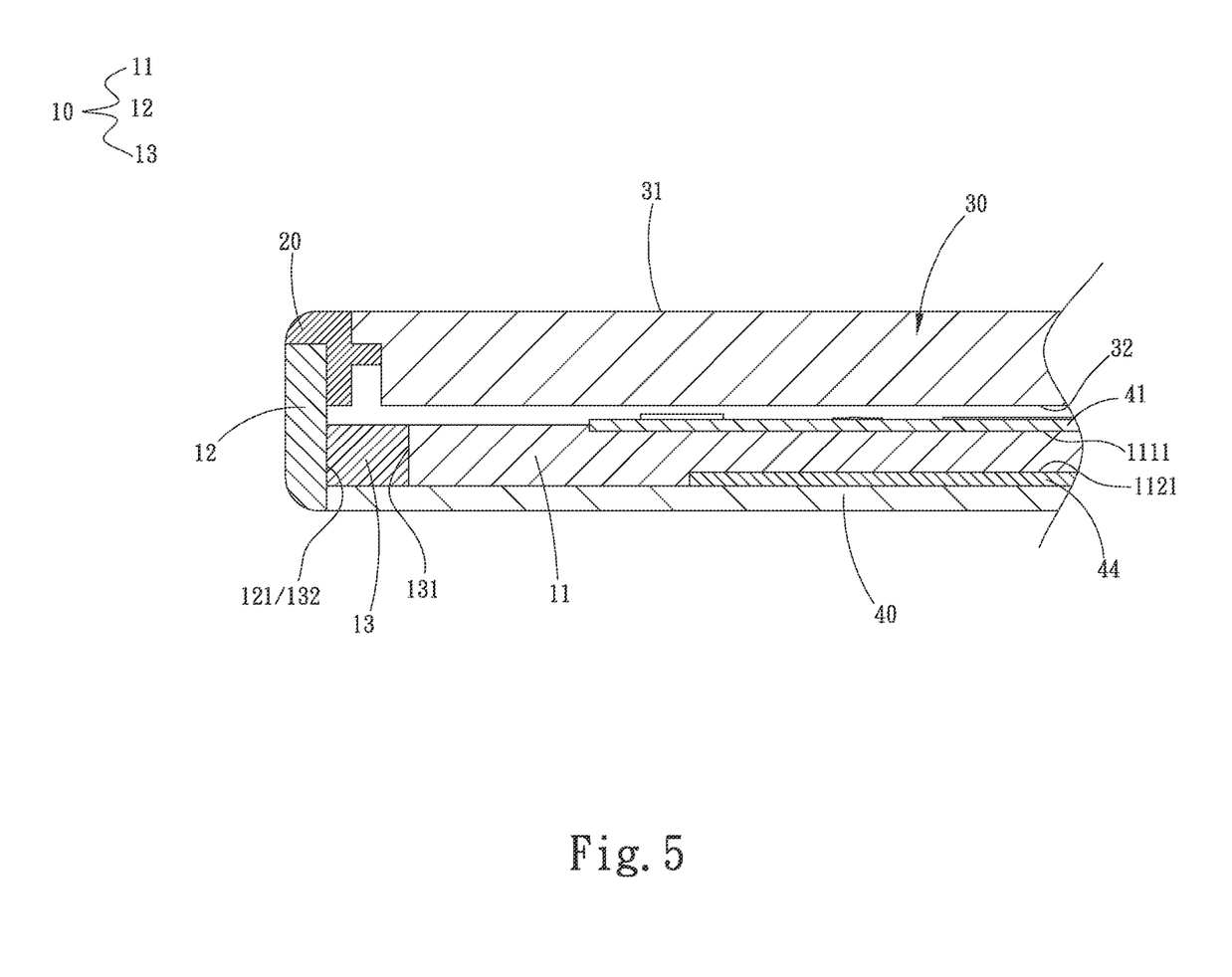
FIG. 5 is a sectional assembled view showing that the internal frame structure of the present invention is applied to the electronic apparatus.

The following is an example for illustrating the practical application of the internal frame:

Please refer to FIGS. 4 and 5. FIG. 4 is a perspective exploded view showing that the internal frame structure of the present invention is applied to an electronic apparatus. FIG. 5 is a sectional assembled view showing that the internal frame structure of the present invention is applied to the electronic apparatus. The electronic apparatus includes an internal frame 10, a front case 20 and a display module 30.

The structure of the internal frame 10 has been described hereinabove as shown in FIGS. 1A, 1B, 2A, 2B and 3 and thus will not be repeatedly described. The internal frame 10 is connected with the front case 20. As shown in the drawings, the front case 20 is positioned on the first surface 111 of the internal frame 10. A receiving space (not shown) is defined between the front case 20 and the internal frame 10. The front case 20 is formed with a window 21.

The display module 30 is fixedly disposed in the receiving space. The display module 30 includes a front face 31 and a back face 32 opposite to the front face 31. The front face 31 is a display section of the display module 30. As shown in FIG. 5, after the display module 30 is mounted in the receiving space, the front face 31 of the display module 30 shows through the window 21. The display module 30 can be a liquid crystal display (LCD) or a touch display or any other substitutive component. In the case that the display module 30 is a touch display panel, the front face 31 not only serves to display images, but also serves as a touch face for touch operation.

The internal frame 10 is further connected with a back case 40. As shown in the drawings, the back case 40 is positioned on the second surface 112 of the internal frame 10. The front case 20 and the back case 40 together define the configuration of the entire electronic apparatus. The outer layer 123a of the frame unit 12a of the internal frame 10 forms at least two opposite sides or four sides of the electronic apparatus and is exposed to external environment as a holding section for a user's hand to hold.

Multiple internal electronic components of the electronic apparatus are disposed on the main body 11 of the internal frame 10. The internal electronic components include a motherboard 41, a battery 42, a front lens module 43 and a rear lens module 44. Various components including processors, power chips and audio/video chips are arranged on the motherboard 41. As shown in the drawings, in this embodiment, the motherboard 41 and the battery 42 are respectively disposed in the recesses 1111, 1121 of the first and second surfaces 111, 112 of the main body 11 of the internal frame 10. The display module 30 and the battery 42 and the front and back lens modules 43, 44 are electrically connected to the motherboard 41. In another embodiment, the back case 40 is integrally formed with the internal frame 10 and the multiple electronic components are disposed on the first surface 111 of the main body 11 of the internal frame 10.

In operation of the electronic apparatus, the internal electronic components such as the motherboard 41 and the battery 42 and the front and back lens modules 43, 44 will generate heat. The heat is transferred to the main body 11 of the internal frame 10. As aforesaid, the heat insulation layer 13 is formed between the main body 11 and the frame unit 12 so that the heat of the main body 11 is insulated from being transferred to the frame unit 12 on the two opposite sides or four sides of the main body 11. In this case, the heat generated by the internal electronic components is only spread over the main body 11 of the internal frame 10 and cannot be transferred to the frame unit 12. Under such circumstance, the frame unit 12 serving as the periphery of the electronic apparatus can be comfortably held by a user's hand without scalding the user's hand or causing bothering inconvenience in use of the electronic apparatus.

In practice, the electronic apparatus can be, but not limited to, a mobile phone or a tablet for illustration purposes only. It should be well known by those who are skilled in this field that the present invention is also applicable to other types of electronic apparatuses.

According to the above arrangement, the present invention at least has the following advantage:

The heat insulation layer 13 is formed between the main body 11 and the frame unit 12 of the internal frame 10 and positioned on at least two opposite sides of the main body 11 to insulate the heat of the main body 11 from being transferred to the frame unit 12 on at least two opposites of the main body 11. The frame unit 12 forms four sides of the electronic apparatus and is exposed to external environment. The two opposite sides (such as, but not limited to, two long sides) serve as a holding section for a user's hand to hold. Therefore, the user's hand can comfortably hold the electronic apparatus.

The present invention has been described with the above embodiments thereof and it is understood that many changes and modifications in the above embodiments can be carried out without departing from the scope and the spirit of the invention that is intended to be limited only by the appended claims.

What is claimed is:

1. An internal frame structure with heat insulation effect, comprising:
    a main body provided with multiple mounting structures to associate with one or more internal electronic components and configured as a flat-plate heat pipe or a heat spreader or a vapor chamber and having an internal closed chamber with a capillary structure and a working fluid disposed in the closed chamber wherein heat generated by the one or more internal electronic components is spread over the main body by a vapor-liquid circulation of the working fluid taking place in the internal closed chamber;
    a frame unit exposed to an external environment as a holding section and located around a peripheral edge of the main body and extending perpendicularly to the main body; and
    a heat insulation layer sandwiched between the main body and the frame unit and positioned on at least two opposite outer sides of the peripheral edge of the main body to insulate the heat of the internal closed chamber of the main body from being transferred to the frame unit, the heat insulation layer having a first side connected with and completely covering corresponding peripheral faces of the main body and a second side connected with and only partially covering corresponding interior peripheral faces of the frame unit.

2. The internal frame structure with heat insulation effect of claim 1, wherein the first and second sides of the heat insulation layer define therebetween a thickness.

3. An electronic apparatus comprising:
    a display module having a front face;
    a front case connected with the display module and formed with a window, the front face of the display module showing through the window;
    an internal frame connected with the front case, the internal frame including:
    a main body provided with multiple mounting structures to associate with one or more internal electronic components and configured as a flat-plate heat pipe or a heat spreader or a vapor chamber and having an internal closed chamber with a capillary structure and a working fluid disposed in the closed chamber wherein heat generated by the one or more internal electronic components is spread over the main body by a vapor-liquid circulation of the working fluid taking place in the internal closed chamber;
        a frame unit exposed to an external environment as a holding section and located around a peripheral edge of the main body and extending perpendicularly to the main body; and
    a heat insulation layer sandwiched between the main body and the frame unit and positioned on at least two opposite outer sides of the peripheral edge of the main body to insulate the heat of the internal closed chamber of the main body from being transferred to the frame unit, the heat insulation layer having a first side connected with and completely covering corresponding peripheral faces of the main body and a second side connected with and only partially covering corresponding interior peripheral faces of the frame unit.

4. The electronic apparatus as claimed in claim 3, wherein the internal frame is connected with a back case or formed with a back case.

5. The electronic apparatus as claimed in claim 3, wherein the display module is a touch display module.

6. The electronic apparatus of claim 3, wherein the first and second sides of the heat insulation layer define therebetween a thickness.

* * * * *